(12) United States Patent
Lazar

(10) Patent No.: US 7,336,210 B2
(45) Date of Patent: Feb. 26, 2008

(54) MULTICHANNEL TIME ENCODING AND DECODING OF A SIGNAL

(75) Inventor: Aurel A. Lazar, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/285,457

(22) Filed: Nov. 22, 2005

(65) Prior Publication Data

US 2006/0261986 A1 Nov. 23, 2006

Related U.S. Application Data

(63) Continuation of application No. PCT/US04/016957, filed on May 27, 2004.

(60) Provisional application No. 60/473,566, filed on May 27, 2003.

(51) Int. Cl.
*H03M 1/00* (2006.01)
(52) U.S. Cl. ...................... 341/110; 341/100
(58) Field of Classification Search ......... 341/100–172
See application file for complete search history.

(56) References Cited

U.S. PATENT DOCUMENTS

| | | | | |
|---|---|---|---|---|
| 5,392,044 A | * | 2/1995 | Kotzin et al. | 341/155 |
| 5,393,237 A | * | 2/1995 | Roy et al. | 439/134 |
| 5,424,735 A | * | 6/1995 | Arkas et al. | 341/157 |
| 5,568,142 A | * | 10/1996 | Velazquez et al. | 341/126 |
| 6,121,910 A | * | 9/2000 | Khoury et al. | 341/143 |
| 6,177,893 B1 | | 1/2001 | Velazquez et al. | |
| 6,332,043 B1 | * | 12/2001 | Ogata | 382/240 |
| 6,441,764 B1 | | 8/2002 | Barron et al. | |
| 6,476,749 B1 | | 11/2002 | Yeap et al. | |
| 6,476,754 B2 | | 11/2002 | Lowenborg et al. | |
| 6,511,424 B1 | * | 1/2003 | Moore-Ede et al. | 600/300 |
| 7,028,271 B2 | * | 4/2006 | Matsugu et al. | 716/1 |

* cited by examiner

*Primary Examiner*—Lam T. Mai
(74) *Attorney, Agent, or Firm*—Baker Botts L.L.P.

(57) ABSTRACT

Analog signals can be fully encoded as an asynchronous time sequence generated by a time encoding machine. With knowledge of the parameters of the time encoding machine, the asynchronous time sequence can be decoded using a non-linear time decoding machine. Such a system can be extended into an encoder/decoder in which a signal is processed in M separate channels. An input signal is applied to the encoder where the signal is provided to an M channel encoder circuit including a filter bank having a total bandwidth partitioned among M adjacent or overlapping filters. Each of the M filters are coupled to a corresponding one of M time encoding machines. The encoder output is represented by M sets of time encoded trigger values. The input signal can be recovered from the M sets of time encoded trigger values by applying the trigger signals to a corresponding M channel decoder which includes M TDMs and filters. The TDMs recover the continuous signal from each channel. The filter outputs xm are then amplitude scaled sm and are combined to recover the input signal. By partitioning the signal bandwidth into M channels, the average pulse rate from each TDM is substantially reduced.

6 Claims, 10 Drawing Sheets ated square wave at output $z(t)$ which is representative of
MULTICHANNEL TIME ENCODING AND DECODING OF A SIGNAL

CROSS-REFERENCE TO RELATED APPLICATION

This application is a continuation of International Application Serial No. PCT/US04/016957, filed May 27, 2004, published Dec. 23, 2004, entitled "MULTICHANNEL TIME ENCODING AND DECODING OF A SIGNAL," which claims priority to U.S. Provisional Application Ser. No. 60/473,566. filed May 27, 2003, each of which are incorporated by reference in their entireties herein, and from which priority is claimed.

FIELD OF THE INVENTION

The present invention relates generally to signal processing and more particularly relates to circuits and methods for recovering a signal from the output of a time encoding machine which maps amplitude information into an asynchronous time sequence.

BACKGROUND OF THE INVENTION

Most signals in the world in which we live are analog, i.e., cover a continuous range of amplitude values. However, most computer systems for processing these signals are binary digital systems. Generally, synchronous analog-to-digital (A/D) converters are used to capture analog signals and present a digital approximation of the input signal to a computer processor. That is, at precise moments in time synchronized to a system clock, the amplitude of the signal of interest is captured as a digital value. When sampling the amplitude of an analog signal, each bit in the digital representation of the signal represents an increment of voltage, which defines the resolution of the A/D converter. Analog-to-digital conversion is used in numerous applications, such as communications where a signal to be communicated may be converted from an analog signal, such as voice, to a digital signal prior to transport along a transmission line. Applying traditional sampling theory, a band limited signal can be represented with a quantifiable error by sampling the analog signal at a sampling rate at or above what is commonly referred to as the Nyquist sampling rate.

While traditional A/D conversion techniques have been effective, techniques based on amplitude sampling have limitations. For example, it has been a continuing trend in electronic circuit design to reduce the available operating voltage provided to integrated circuit devices. In this regard, over the last decade, power supply voltages have decreased from five volts to three volts and there remains a desire to reduce this further, such as to one volt or less. While digital signals can be readily processed at the lower supply voltages, traditional synchronous sampling of the amplitude of a signal becomes more difficult as the available power supply voltage is reduced and each bit in the A/D or D/A converter reflects a substantially lower voltage increment. Thus, there remains a need to develop circuits and methods for performing high resolution A/D and D/A conversion using substantially lower power supply voltages which will be desired in future designs.

In contrast to sampling a signal using synchronous A/D converters, circuits are known for performing asynchronous time encoding of a signal. One such circuit, referred to as an asynchronous sigma delta modulator (ASDM) is disclosed in U.S. Pat. No. 6,087,968 to Roza ("the '968 patent"). An example of such an ASDM is illustrated herein in FIG. 1. The ASDM generates an asynchronous duty cycle modulated square wave at output $z(t)$ which is representative of the input signal, $x(t)$. In the '968 patent, an ASDM is used to form an analog-to-digital converter by providing the output of the ASDM to a sampler and a linear decimating filter which is sampled at a rate above the bandwidth of the input signal. A problem with this approach is that the ASDM introduces non-linearities in $z(t)$ which cannot be recovered using a linear decimation filter. As a result, the degree of signal recovery is limited. Another shortcoming with this approach is that the output of the ASDM must be over sampled by a high frequency clock. As the bandwidth of the input signal increases, the clock frequency also increases. Even if the desired clock rate can be achieved, such high frequency clocks demand significant power consumption.

While the '968 patent discloses the use of an ASDM to time encode an analog signal, certain characteristics of the ASDM circuit were not previously appreciated. For example, the '968 patent does not disclose a method of designing the ASDM in order to have the ASDM output signal be fully invertible, i.e., allow for theoretically perfect recovery of the input signal. Further, the '968 patent does not disclose that the ASDM is a non-linear system and that a non-linear recovery method is required to fully take advantage of this circuit.

In WO 2004/039021 the present inventors describe systems and methods for asynchronous time encoding an analog signal and decoding the time encoded signal with perfect recovery or recovery with an arbitrary error. In this international patent publication, such systems are referred to as time encoding machines (TEM) and time decoding machines (TDM). One form of TEM is referred to as an integrate and fire neuron. Since a number of sensory systems, such as the retina and cochlea, have previously been modeled as a bank of overlapping filters fed from a common signal with each filter output feeding an integrate and fire neuron, it would be advantageous to extend the teachings of WO 2004/039021 to systems and methods in which filterbanks and multiple processing paths are employed to further realize the advantages of the use of time encoding machines and time decoding machines.

OBJECTS AND SUMMARY

It is an object of the present invention to provide circuits and methods to encode and decode a band limited signal using asynchronous processes.

It is an object of the present invention to provide circuits and methods to encode and decode a band limited signal using multichannel processing of asynchronous processes.

It is another object of the present invention to provide non-linear operations for recovering an input signal from a multichannel output of an M channel encoder using a plurality of time encoding machines.

It is an object of the present invention to reduce the average spike rate from the output of a time encoding machine by employing bandwidth partitioning and a plurality of time encoding machines operating in a parallel manner.

In accordance with the present invention, a multichannel TEM encoder circuit is provided which includes a filter bank having an input bandwidth and is formed with a number (M) of filter elements. The M filter elements are selected such that the response of the M filters are at least adjacent and collectively at least fully span the bandwidth of the filter bank. The encoder circuit also includes a number (M) of time encoding machines (TEMs), with each of the M TEMs being operatively coupled to a corresponding one of the M filter elements.

A decoder circuit for decoding a signal encoded by a multichannel TEM encoder is also provided. The multichannel TEM encoder includes a bank of M time decoding machines (TDMs), with each of the M TDMs having an input for receiving a set of asynchronous trigger values representing at least a portion of a signal to be decoded. A bank of M filter elements is provided with each of the M filter elements being operatively coupled to a corresponding one of the M TDMs. The bank of M TDMs and M filter elements having an overall response selected to at least substantially invert the encoding process of the multichannel TEM encoder used to encode the signal.

Also in accordance with the present invention, a method is provided for recovering an input signal x(t) from the output signal of a Multichannel Time Encoding Machine (TEM) encoder which provides a set of M binary asynchronous time sequences in response to a bounded input signal x(t). The method includes receiving the asynchronous time sequences from the M TEMs of the encoder and measuring the transition times, such as the time of zero crossings, of the TEM output signals. From each set of TEM transition times, a corresponding set of weighted impulse functions is generated. The generation of weighted impulse functions can be computed, such as by applying an algorithm that resolves a non-linear recursive relationship or matrix form non-linear relationship. The input signal can be recovered by applying the set of weighted impulse functions to an impulse response filter. If the transition times are exactly known, the Multichannel TEM encoder is fully invertible and the input signal can be exactly recovered by the present methods. If the transition times are quantized, the quantization level determines the accuracy of recovery in a manner that is analogous to conventional amplitude sampling.

In one embodiment, the weighted impulse functions are a set of weighted Dirac delta functions which are centered in the time interval of successive zero crossings of the TEM outputs. The weighting value for each impulse function is related to the design parameters of the TEMs and the transition times. For example, the weighted impulse functions can have weighting value coefficients $c_k$ which can be expressed in matrix form as a column vector, c:

$$c = (G + \lambda^* I)^+ q$$

where $\lambda$ is a constant, I is an identity matrix and q is a column vector and $$\int_{t_k}^{t_{k+1}} x(u)\,du = (-1)^k [-b(t_{k+1} - t_k) + 2\kappa\delta]$$

$$q = \left[\int_{t_k}^{t_{k+1}} x(u)\,du\right] \text{ and } G = \left[\int_{t_l}^{t_{l+1}} g(u - s_k)\,du\right] \text{ and where } G^+$$

denotes the pseudo-inverse of matrix G. The use of the constant $\lambda$ allows for a smoother estimation in the presence of noise. When $\lambda=0$, the system is noise free and the recovery is ideal. The input signal x(t) can be recovered from the vector c by passing a train of impulse functions weighted by this vector through an ideal impulse response filter. The impulse response filter can be described as $g(t)=\sin(\Omega t)/\pi t$. The recovery of the input signal can then be expressed in matrix form as: $x(t)=gc$, where g is a row vector, $g=[g(t-s_k)]^T$.

The TEMs can take on many forms so long as the transition times from the TEM outputs relate to the input signal in an invertible manner. Examples of TEM circuits include an asynchronous sigma delta modulator circuit and an integrate and fire neuron circuit.

The methods of the present invention can be embodied in a time decoding machine (TDM) circuit. The TDM will generally be formed using a digital microprocessor or digital signal processing integrated circuit which has been programmed to carry out the methods of the present invention.

BRIEF DESCRIPTION OF THE DRAWING

Further objects, features and advantages of the invention will become apparent from the following detailed description taken in conjunction with the accompanying figures showing illustrative embodiments of the invention, in which:

FIG. 2B is a graphical representation of an analog input signal, x(t), to the system of FIG. 2A and FIG. 2C is a graphical representation of the time encoded signal z(t) from the time encoding machine;

Figure 1:
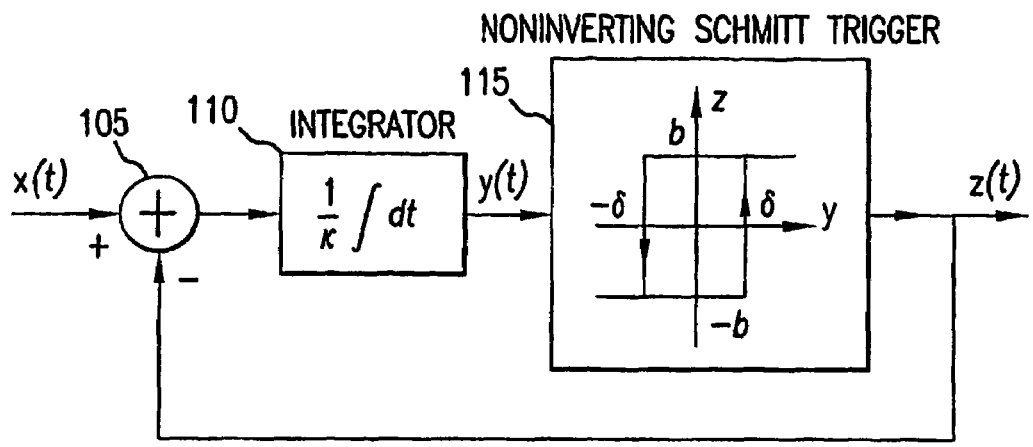
FIG. 1 is a block diagram of a known circuit embodiment of an asynchronous sigma delta modulator (ASDM), which can be used as an embodiment of a time encoding machine (TEM) in the present invention.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

The present invention uses time encoding to digitize an analog signal and also uses appropriate non-linear decoding methods for subsequent recovery of the input signal. Thus, the systems and methods described apply to analog-to-digital (A/D) conversion and digital-to-analog (D/A) conversion using time encoding of a signal. In particular, the current invention employs a multichannel encoding and decoding approach which provides reduced average trigger times from each of the time encoding machines (TEM) used in the signal encoding process.

In the present application, the operation and implementation of time encoding machines (TEM) and time decoding machines (TDM) are provided. As used herein, a TEM is a circuit or process which receives a bounded input signal and generates an asynchronous set of binary transitions, the timing of which are related to the amplitude of the input signal. More generally, a TEM is a circuit or process which maps amplitude information into time information. A time decoding machine is a circuit or process which is responsive to transition time data from a TEM and can process the transition time data to recover the input signal with arbitrary accuracy.

Figure 11:
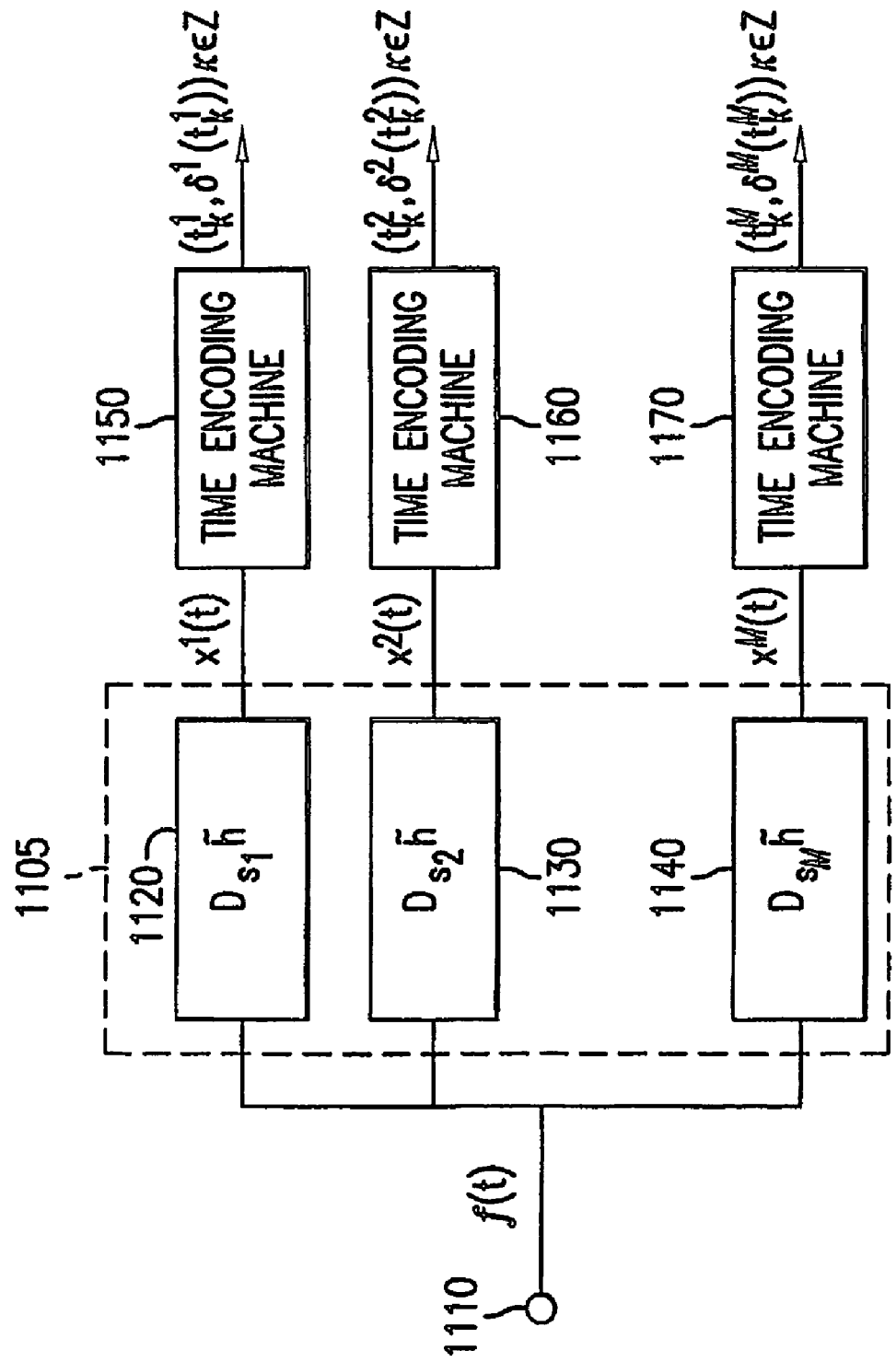
FIG. 11 is a block diagram of a signal processing system providing multichannel processing using a bank of M filters coupled to M channels of corresponding TEMs to encode an analog signal with reduced bandwidth processing.
Figure 12:
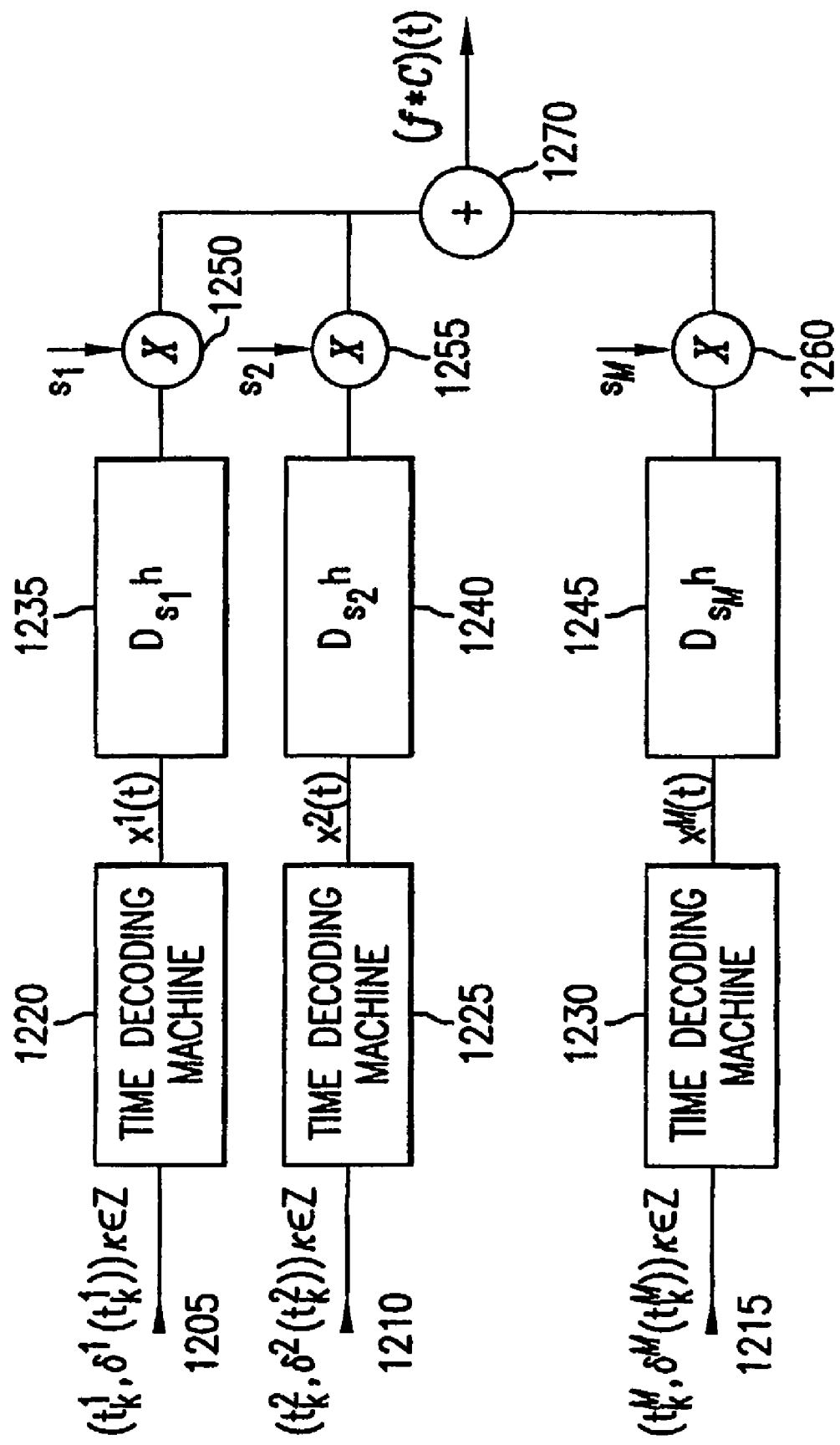
FIG. 12 is a block diagram of a signal processing system to decode a multichannel time encoded signal using a bank of M TDMs coupled to M channels of filters to a signal encoded in accordance with the circuit of FIG. 11.

In the description which follows, the general theory and implementation of time encoding machines (TEM) and time decoding machines (TDM) is presented in connection with the description of FIGS. 1-10. FIGS. 11 and 12, and the description associated therewith, describe the use of TEM and TDM circuits in a multichannel processing approach which further reduces the average rate of transitions at the output of the TEM (average spike rate). Reducing the average spike rate in an asynchronous circuit such as the TEM provides similar advantages to that observed by reducing the clock rate in a synchronous circuit.

Figure 2A:
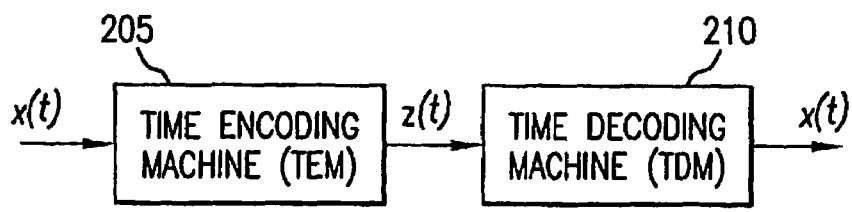
FIG. 2A is a simplified block diagram illustrating a system in accordance with the present invention including a time encoding machine (TEM) for asynchronous time encoding of an input signal and a time decoding machine for subsequently recovering the input signal from the TEM output signal.
Figure 2B:
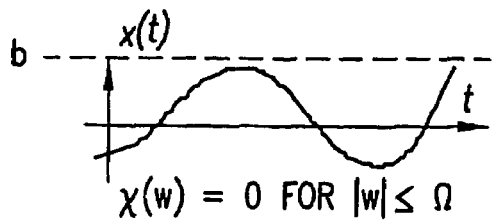
FIGS. 2B and 2C pictorially represent the operation of the ASDM of FIG. 1 operating as a time encoding machine where
Figure 2C:
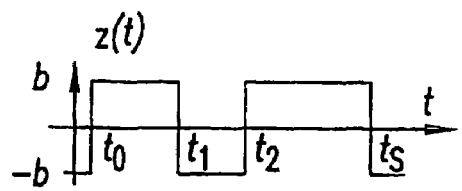

The block diagram of FIG. 2A provides a simplified description of the present invention. A band limited, amplitude limited signal x(t), as shown in FIG. 2B, is applied to the input of a Time Encoding Machine (TEM) 205 which generates a binary, asynchronous output z(t), illustrated in FIG. 2C. The TEM output signal z(t) is an asynchronous binary output whose zero crossings ($t_0, t_1, \ldots t_k$) are related to the amplitude of the input signal. It is now understood in connection with the present invention that the signal z(t) relates to the input signal x(t) in a non-linear fashion. By using the inverse of the non-linear relationship in a decoding algorithm in a Time Decoding Machine (TDM) 210, the input signal, x(t), can be recovered from knowledge of the zero crossings in z(t). If the zero crossings in z(t) are known precisely, then perfect recovery of the input signal is possible. If there is error attributable to the measurement of the zero crossings, the error in the recovery of x(t) is equivalent to magnitude of the error in the recovery of a signal using traditional amplitude sampling. That is, for the same number of bits used in sampling the signal, the current time encoding methods yield comparable results to known amplitude sampling systems.

FIG. 1 is a block diagram of a known Asynchronous Sigma Delta Modulator (ASDM) circuit which is suitable for use in one embodiment of TEM 205. The circuit of FIG. 1 generates a two-state output signal (b, −b) whose zero crossings are asynchronously determined by the amplitude of the input signal x(t) in combination with design parameters of the circuit. Because the timing of the zero crossings is asynchronously determined by the amplitude of the input signal, the ASDM can be viewed as a form of time encoding machine (TEM). If the input signal x(t) to the TEM is a band limited signal, then the system is invertible and the input signal, x(t), can be recovered from the TEM output signal, z(t), using an appropriate recovery process in the TDM. If the transition times are known exactly, the input signal can be fully recovered by the TDM. Accordingly, by knowing the expected maximum bandwidth of an input signal, the parameters of the TEM can be designed accordingly.

Figures 3A, 3B:
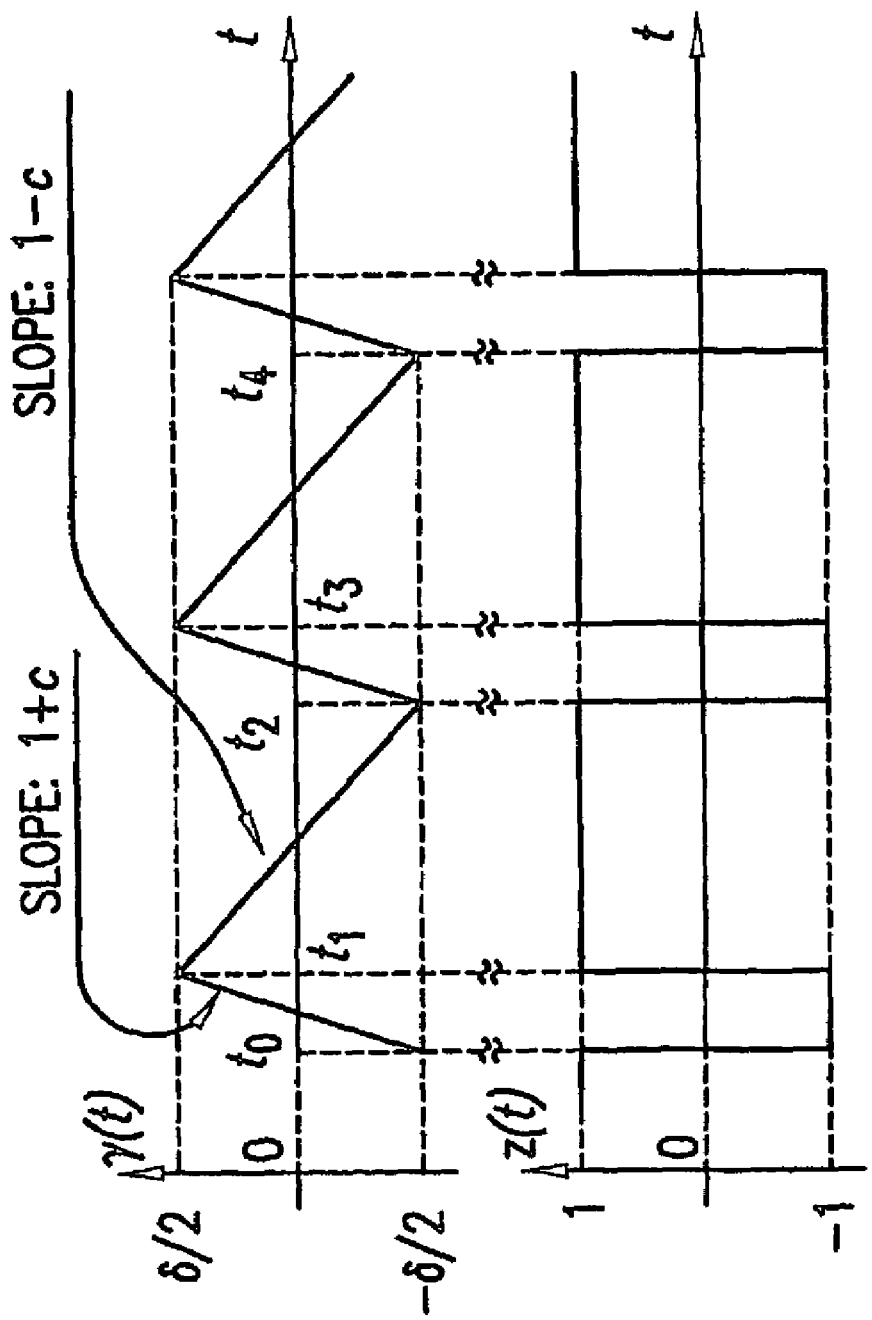
FIGS. 3A and 3B are timing diagrams illustrating the operation of a TEM for a DC input signal.

The underlying operating principle of a TEM can be understood by reference to FIGS. 1, 3A and 3B. In order to realize complete recovery, it is expected that the input signal x(t) is bounded in both bandwidth, $\Omega$, and amplitude, c. The input signal, x(t), is applied to an adder 105 which is coupled to the input of an integrator circuit 110. The integrator circuit 110 has an integration time constant, $\kappa$. The output of the integrator circuit 110 is coupled to the input of a non-inverting Schmitt trigger 115. The Schmitt trigger has two design parameters, the output voltage swing (b, −b) and the hysteresis value, $\delta$. The output of the Schmitt trigger 115 provides a TEM output signal, z(t). The output of the Schmitt trigger 115 is also fed back to an inverting input to the adder 105. As a result, the bounded input signal x(t), $|x(t)| \leq c < b$, is biased by a constant amount ±b before being applied to the integrator 110. This bias guarantees that the output of the integrator y(t) is either a positive-increasing or negative-decreasing function of time.

Referring to FIGS. 3A and 3B, in the steady state, the TEM output signal z(t) can assume one of two states. In the first state, the TEM is in the state z(t)=−b and the input to the Schmitt trigger increases from −$\delta$ to $\delta$. When the output of the integrator circuit 110 reaches the maximum value $\delta$, a transition of the output z(t) from −b to b is triggered and the feedback signal applied to adder 105 becomes negative. In the second steady state of operation, the TEM is in the state z(t)=b and the integrator output steadily decreases from $\delta$ to −$\delta$. When the maximum negative value −$\delta$ is reached, z(t) will reverse to −b. Thus, a transition of the output of the TEM from −b to b or from b to −b takes place each time the integrator output reaches the triggering threshold $\delta$ or −$\delta$. The timing of these transitions, which result in the zero crossings, $t_0 \ldots t_k$, depends on both the amplitude of the input signal x(t) and the design parameters of the TEM, such as the hysteresis of the Schmitt trigger, $\delta$. Thus, the TEM is effectively mapping amplitude information into timing information using a signal dependent sampling mechanism.

The Schmitt trigger 115 can be characterized by two design parameters: the output voltage swing (b, −b) and the hysteresis value, $\delta$. In order for the ASDM of FIG. 1 to operate as an invertible TEM, the amplitude of the input signal c must be less than output voltage swing of the Schmitt trigger, i.e., $|c| < b$. It has also been found that to fully recover the input signal from the TEM output signal, the hysteresis value, $\delta$, must be less than the period of the Nyquist sampling rate. This can be expressed as: $\delta < (\pi/\Omega)((b-c)/\kappa)$, where $\Omega$ represents the bandwidth of the input signal x(t), $\kappa$ represents the integration constant of the TEM, and c represents the maximum amplitude of the input signal. Thus, the parameters of the TEM are to be set based on the expected limits of the input signal.

The set of trigger times $t_k$ which comprise the output of the TEM can be expressed by the recursive equation:

$$\int_{t_k}^{t_{k+1}} x(u)du = (-1)^k[-b(t_{k+1} - t_k) + 2\kappa\delta]. \quad \text{(Eq. 1)}$$

for all integer values of k, i.e., k, k∈Z. where κ is the integration constant of the TEM, δ is the hysteresis value of the Schmitt trigger in the TEM and b is the amplitude output voltage swing of the TEM output.

By dividing by b on both sides of equation (2), the output can be normalized and can be expressed as:

$$\int_{t_k}^{t_{k+1}} \frac{x(u)}{b}du = (-1)^k\left[-(t_{k+1}-t_k) + \frac{2\kappa\delta}{b}\right]. \quad \text{(Eq. 2)}$$

for all k, k∈Z, i.e., k is an element of the set of all integer numbers. Therefore, the increasing time sequence (t$_k$), k∈Z, can be generated by an equivalent circuit with integration constant κ=1 and a Schmidt trigger with parameters κδ/b and 1. In what follows, without any loss of generality, this simplified version of the TEM will be used.

The input to the TEM is a bounded function x(t) with |x(t)|≦c<1 for all t, t∈R., i.e., t is an element of the set of all real numbers. The output of the TEM is function z taking two values z: R→{−1,1} for all t, t∈R, with transition times t$_k$, k∈Z, generated by the recursive equation $$\int_{t_k}^{t_{k+1}} x(u)du = (-1)^k[-(t_{k+1}-t_k) + \delta], \quad \text{(Eq. 3)}$$

for all k, k∈Z. This equation illustrates the mapping of the amplitude information of the signal x(t), t∈R, into the time sequence (t$_k$), k∈Z.

In the description that follows, the operation of the TEM is evaluated for the case where the input signal is a constant DC value. For this example, it is assumed that the TEM takes the form substantially presented in FIG. 1 and consists of an integrator with integrator constant κ=1 and Schmitt trigger with parameters δ from −δ/2 to δ/2 and b=1. In this case, x(t)=c (not necessarily positive), where c denotes a given DC level. If c<−1 or c>1 the output of the integrator would become unbounded, and thus the overall TEM would become unstable. This condition might lead to information loss because the output z(t) cannot track the input x(t). By bounding the input amplitude such that |c|<1, the TEM is stable and the sequence of transition times reduces to the simple recursion:

$$t_{k+1} = t_k + \frac{\delta}{1+(-1)^k c}, \quad \text{(Eq. 4)}$$

and, therefore, t$_{k+1}$>t$_k$, k∈Z.

The integrator output, y(t), and the TEM output, z(t) for the case where the input signal is a constant value, are illustrated in the timing diagrams of FIGS. 3A and 3B, respectively. Referring to FIGS. 3A and 3B, it is apparent that both the integrator output and TEM output, y(t) and z(t), respectively, are periodic signals with a period T. The period T can be expressed as:

$$T = t_{k+2} - t_k = \frac{2\delta}{1-c^2}. \quad \text{(Eq. 5)}$$

for all k, k∈Z.

The mean value (the 0-th order Fourier-series coefficient) of z(t) can be expressed as:

$$\frac{(-1)^k[-(t_{k+1}-t_k)+(t_{k+2}-t_{k+1})]}{T} = c, \quad \text{(Eq. 6)}$$

Equation 6 illustrates that the input signal and the output signal from the TEM have the same average value.

Figure 4:
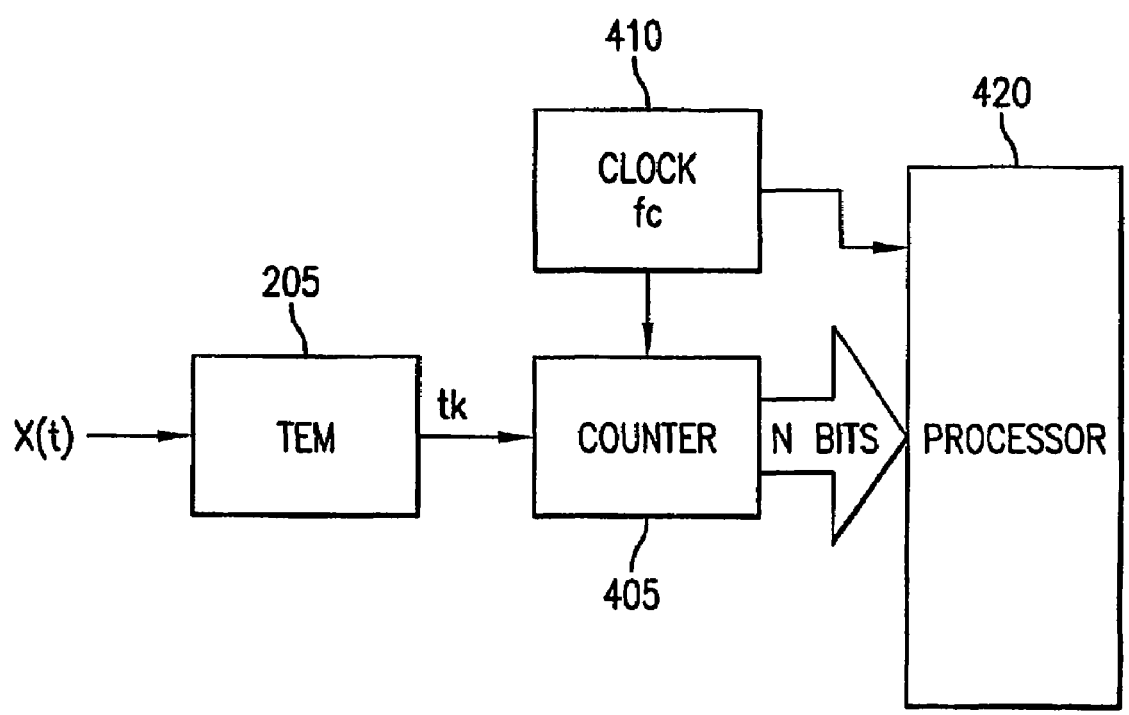
FIG. 4 is a block diagram of a circuit including a TEM and one embodiment of a quantizer for the TEM output signal.

The transition times from the TEM output can be measured using conventional circuits and methods. FIG. 4 is one example of a circuit for quantizing and measuring the transition times t$_K$ from the output of a TEM. The TEM 205 has an output which is coupled to a strobe input of a counter circuit 405. The counter circuit 405 is also coupled to a clock circuit 410 which increments the counter value on each clock pulse. Thus the counter circuit 405 maintains a running count of clock pulses. On each occurrence of t$_K$, the current counter value in counter circuit 405 is strobed to an N-bit output bus of the counter circuit 405. The counter output can then be provided to a digital processor 410 for storage and processing in accordance with the methods described herein. The counter values from the counter circuit 405 are transferred to the processor 410 at a rate equal to or greater than the Nyquist frequency of the input signal. Thus, the timing of the zero crossings are being quantized with a definable error based on the number of bits of resolution in the counter circuit 405. The processor receives the quantized values of t$_k$ as an N bit word from the counter circuit 405 on each occurrence of t$_k$.

Figure 5:
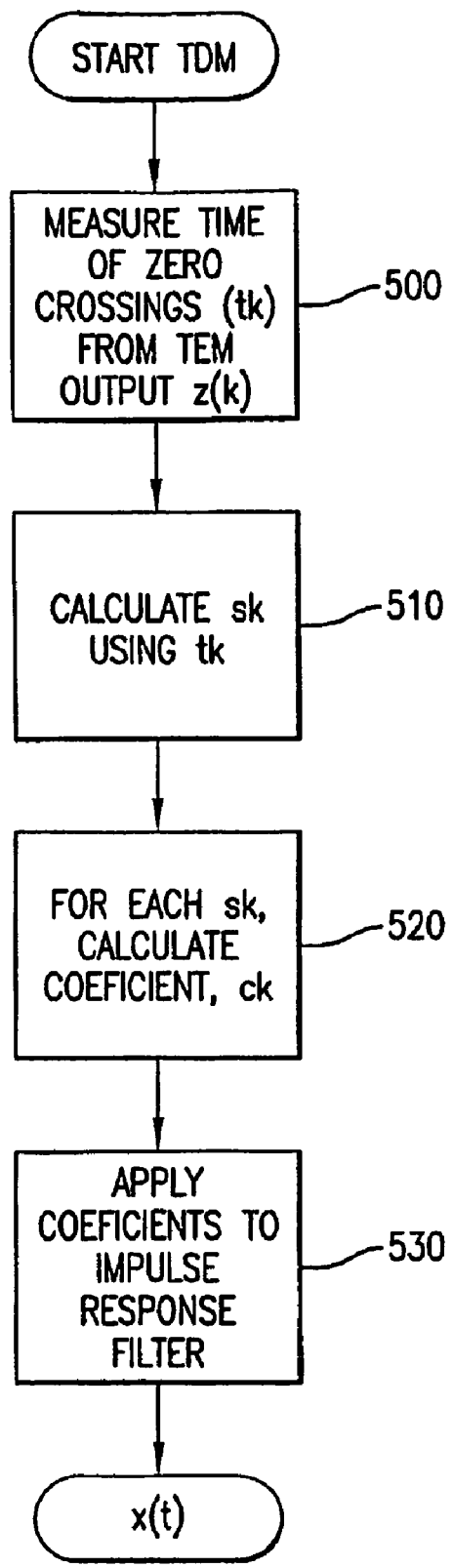
FIG. 5 is a simplified flow chart illustrating the operations of the time decoding machine (TDM) of the present invention.
Figure 6:
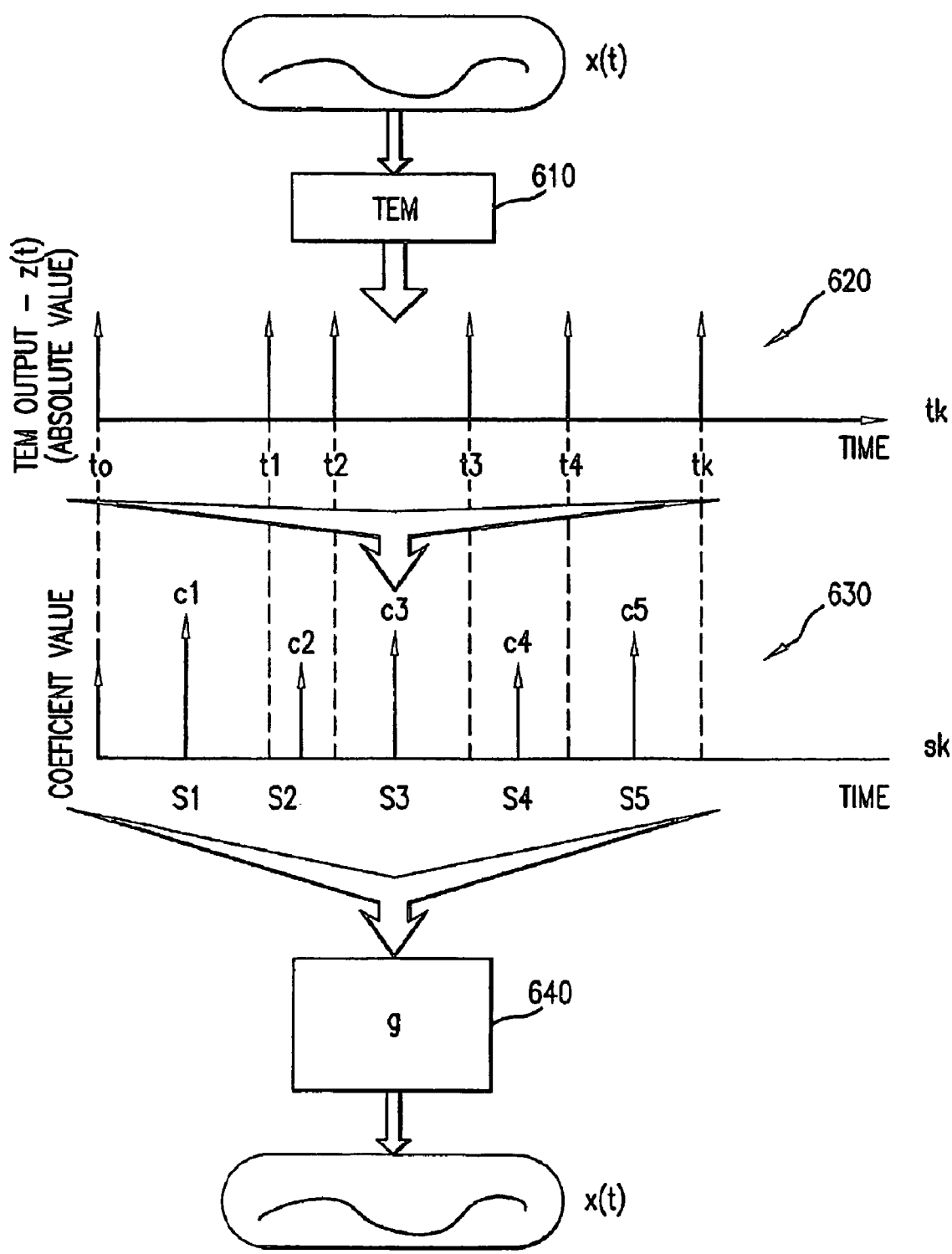
FIG. 6 is a pictorial representation of the operation of the time decoding machine.
Figure 7A:
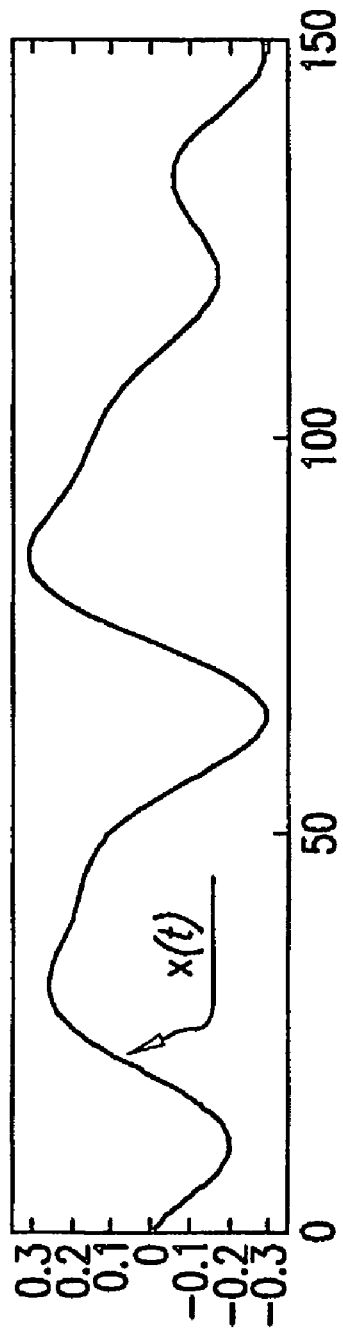
FIGS. 7A and 7B are timing diagrams illustrating the operation of a TEM in response to a time varying input signal, x(t)
Figure 7B:
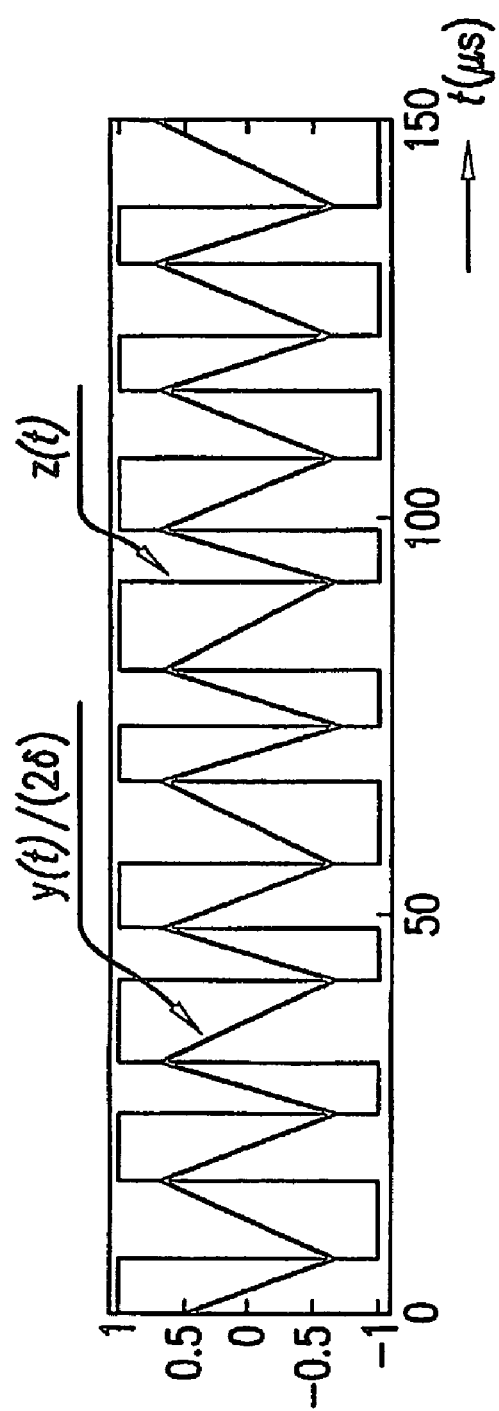

The operation of the Time Decoding Machine (TDM) 210 will be described in connection with the flow chart of FIG. 5 and pictorial diagram of FIG. 6. FIG. 5 is a simplified flow diagram illustrating the operation of the TDM 210. As noted above, the TEM 205 operates by generating a set of signal dependent transition times (Step 500). The transition times are discrete real values and can be designated as t$_K$=[t$_0$, t$_1$, t$_2$, ..., t$_K$]. From the set of signal dependent transition times, t$_K$, the input signal x(t) can be represented as a set of weighted Dirac delta functions, S$_k$. Each of the weighted delta functions has a time value determined by the center of each successive time interval(t$_K$, t$_{K+1}$) and having a weighting value, c$_k$, associated therewith. For example, referring to FIG. 6, S1 in 630 has a time value at the median value between t$_0$ and t$_1$ which are illustrated in 620 (Step 510).

The values of the weighting coefficients can be determined from the transition times, t$_k$, and the Schmitt trigger hysteresis value, δ (520). The coefficients c$_k$ can be expressed in matrix form as a column vector, c:

$$c=(G+\lambda^*I)^+q \quad \text{(Eq. 7)}$$

where λ is a constant, I is an identity matrix and q is a column vector and $$\int_{t_k}^{t_{k+1}} x(u)du = (-1)^k[-b(t_{k+1}-t_k) + 2\kappa\delta]$$

-continued $$q = \left[\int_{t_k}^{t_{k+1}} x(u)\,du\right] \text{ and } G = \left[\int_{t_l}^{t_{l+1}} g(u-s_k)\,du\right] \text{ and where } G^+$$

denotes the pseudo-inverse of matrix G. The use of the constant λ allows for a smoother estimation in the presence of noise. When λ=0, the system is noise free and the recovery is ideal.

The input signal x(t) can be recovered from the vector c by passing this vector through an ideal impulse response filter (Step 530). The impulse response filter can be described as $g(t)=\sin(\Omega t)/\pi t$. Such a filter can be formed as a digital filter using suitable programming of processor 420 (FIG. 4). It will be appreciated that other embodiments, such as analog filters and other digital filter embodiments are also contemplated by the present invention. The recovery of the input signal can be expressed in matrix form as:

$$x(t)=gc, \text{ where } g \text{ is a row vector, } g=[g(t-s_k)]^T \quad (\text{Eq. 8})$$

The method steps described in connection with the flow diagram of FIG. 5 are represented pictorially in FIG. 6. An input signal x(t) is applied to the input of a TEM 610, such as a properly designed ASDM as illustrated in FIG. 1 and described above. The TEM 610 provides an output comprising signal dependent asynchronous timing data derived from x(t) 620. Based on the value of the hysteresis of the TEM, δ, the time sequence of z(t) is converted into a matrix of weighted Dirac delta functions, $S_k$ 630. The weighted Dirac delta functions have a time value centered between consecutive zero crossings $t_k$. The weighting value is expressed above, $c=(G+\lambda*I)^+$. The sequence $S_k$ 630 can then be applied to an ideal impulse response filter g (step 640) which recovers the original signal, x(t).

In the method described above, perfect signal recovery can be achieved with knowledge of the signal bandwidth, upper bound on the signal amplitude with respect to the output swing of the Schmitt trigger and the hysteresis value of the Schmitt trigger, δ, and exact knowledge of the transition times, $t_k$. However, in many practical cases, errors are attributable in determining the values of the trigger times in z(t) as well as in determining the exact value of the hysteresis.

The error associated with the measurement of the trigger times results from quantization of the timing information such that the transition times are not exactly known, i.e., the times are known within the quantization level used. It can be shown that the resulting error from time encoding is comparable to that of amplitude sampling, when the same number of bits of resolution are used in each case.

A reasonable comparison between the effects of amplitude and time quantization can be established if we assume that the quantized amplitudes and quantized trigger times are transmitted at the same bitrate. Since $x(s_k)$ and $T_k$ are associated with the trigger times $t_k$ and $t_{k+1}$, the same transmission bitrate is achieved if the $x(s_k)$'s and the $T_k$'s are represented by the same number of bits N. With $-c \leq x \leq c$, the amplitude quantization step amounts to $\epsilon=2c/2^N$.

For time encoding $T_{min}=\min_{k \in Z} T_k \leq T_K \leq \max_{k \in Z} T_k = T_{max}$ or equivalently $0 \leq T_k - T_{min} \leq T_{max} - T_{min}$. Therefore, if $T_{min}$ is exactly known, then only measuring $T_k - T_{min}$, k∈Z, in the range $(0, T_{max} - T_{min})$ is needed. Hence:

$$\Delta = \frac{T_{max} - T_{min}}{2^N} = \frac{1}{2^N}\left(\frac{\delta}{1-c} - \frac{\delta}{1+c}\right) = \frac{\delta\epsilon}{1-c^2} \quad (\text{Eq. 9})$$

where Δ is the quantization step of the time sequence. Equation 9 illustrates how the quantization step of the time sequence is related to the amplitude quantization step.

The hysteresis value δ is often determined by analog components in the TEM, such as resistors and capacitors which exhibit a base line tolerance as well as variations over temperature, time and the like. The error that is associated with variations in the exact value of δ can be substantially eliminated by the use of a compensation method that is described below.

In the case where the TEM is embodied as an ASDM, such as illustrated in FIG. 1, following each transition of z(t), the polarity of the signal changes. This is evident from the equations for calculating $t_k$, such as Equation 3, which includes a term $(-1)^k$ which reflects this sign change on each transition, k. Since Equation 3 also includes δ for each instance of $t_k$, it will be appreciated that by evaluating the signal over a window spanning two consecutive instances of $t_k$, the δ term will be positive in one case and negative in the next, thereby canceling the effect of any variation in δ over this window. The principle behind the δ compensated algorithm can be described as follows:

$$h = \frac{1}{2}[g(t-t_{k+1})]^T, \quad q = \left[\int_{t_k}^{t_{k+2}} x(u)\,du\right] \text{ and}$$

$$H = \frac{1}{2}\left[\int_{t_l}^{t_{l+2}} g(t-t_{K+1})\,du\right].$$

The band limited signal x can be perfectly recovered from its associated trigger. times $(t_k)$, k∈Z, as $$x(t) = \lim_{l \to \infty} x_l(t) = hH^+q. \quad (\text{Eq. 10})$$

where $H^+$ denotes the pseudo-inverse of H. Furthermore, $$x_l(t) = hP_l q,$$

where $P_l$ is given by $$P_l = \sum_{k=0}^{l}(I-H)^k.$$

More generally, by defining a matrix B with ones on two diagonals:

$$B = \begin{matrix} \ddots & & & & & & \\ \cdots 1 & 1 & 0 & 0 & 0 & 0 & \cdots \\ \cdots 0 & 1 & 1 & 0 & 0 & 0 & \cdots \\ \cdots 0 & 0 & 1 & 1 & 0 & 0 & \cdots \\ \cdots 0 & 0 & 0 & 1 & 1 & 0 & \cdots \\ & & & & & & \ddots \end{matrix}$$

the input signal recovery algorithm can be expressed:

$$x(t) = g^T(t)[(B^{-1})(BG(B^{-1})^T)^+[Bq] \qquad (\text{Eq. 11})$$

The two diagonal row B matrix illustrated above is but one form of processing which can be used. It will be appreciated that other general expressions of this matrix can also be applied.

Figure 8:
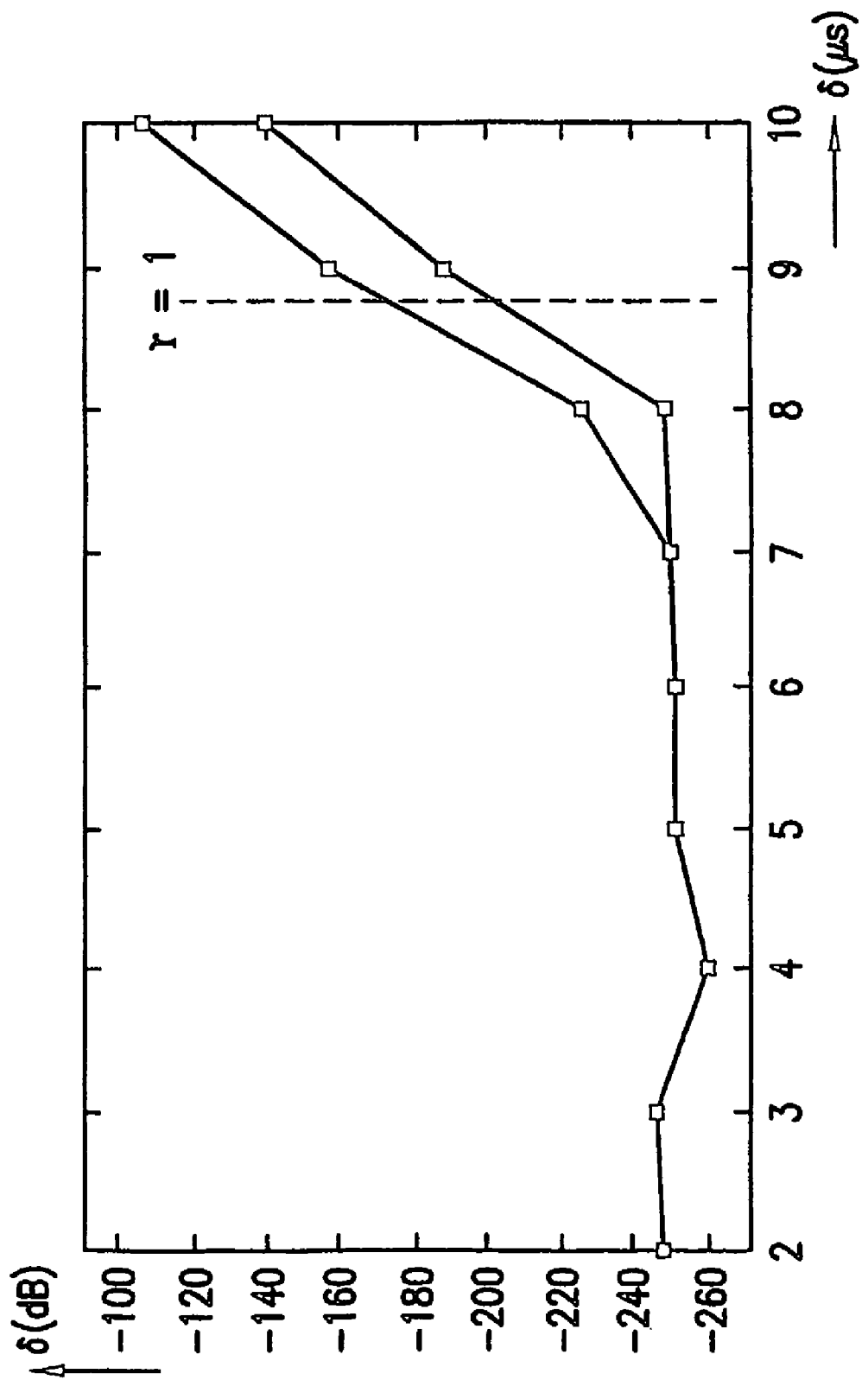
FIG. 8 is a graph illustrating recovery error versus $\delta$ for a compensated recovery algorithm in accordance with the present invention.

The compensation δ-insensitive recovery algorithm achieves perfect recovery. Simulation results for the δ-sensitive and δ-insensitive recovery algorithms are shown in FIG. 8, with graph lines denoted by stars and circles, respectively.

The δ-insensitive recovery algorithm recognizes that in two consecutive time periods of $t_k$, the period of each cycle is dependent on δ and the output changes polarity from b to –b or vice versa. By looking at the output z(t) over two consecutive time periods, i.e., $t_n$, $t_{n+2}$, the error in the recovered version of x(t) attributable to δ can effectively be eliminated.

Figure 9:
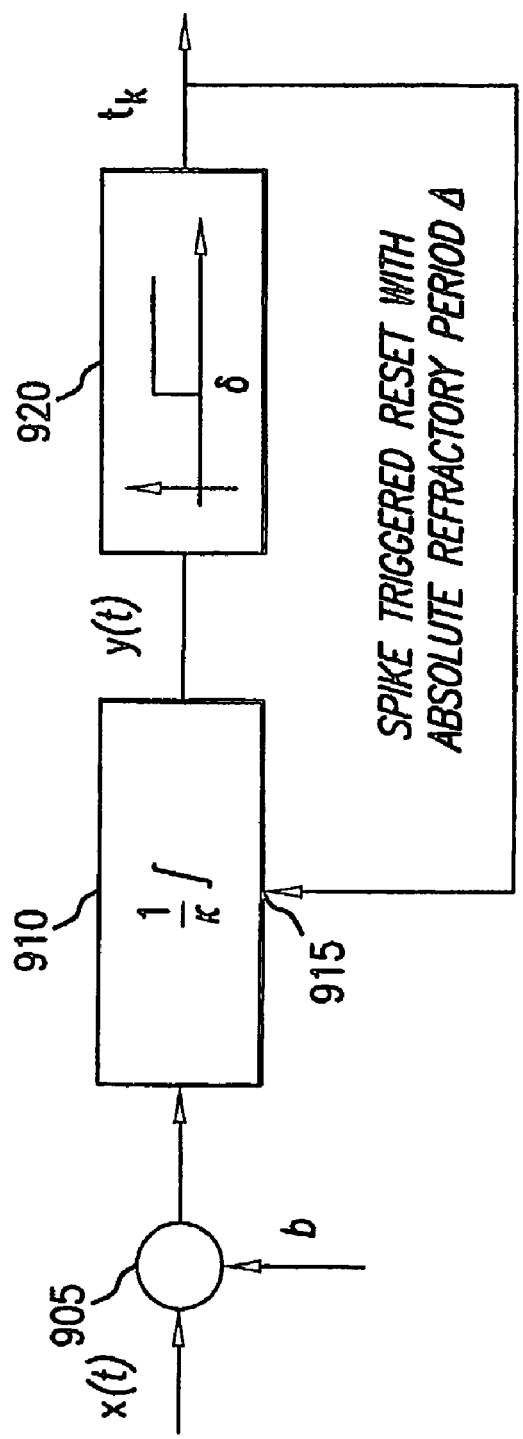
FIG. 9 is a block diagram of an alternate embodiment of a TEM circuit using an integrate and fire neuron circuit to time encode an input signal.
Figure 10:
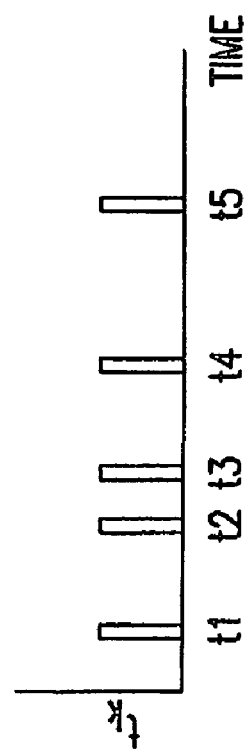
FIG. 10 is a graph illustrating an example of the output signal from the TEM of FIG. 9.

FIG. 9 illustrates an alternate embodiment of a TEM. The circuit of FIG. 9 can be described as an integrate and fire neuron with an absolute refractory period, Δ. The TEM of FIG. 9 includes an adder 905 to which an input signal x(t) is applied. The other terminal of the adder circuit 905 is coupled to a fixed bias voltage, b. The adder 905 is coupled to the input of an integrate and dump circuit 910. The integrate and dump circuit 910 integrates the input signal with an integration constant of κ until a dump or reset signal is received on input 915. The output of the integrator is applied to a threshold detector 920 which has an output which is zero until the input signal exceeds the threshold level, δ. When the input voltage to the threshold detector 920 exceeds the threshold level value the output transitions to a logic 1. The output of the threshold detector 920 is coupled to the dump input 915 of the integrate and dump circuit 910. A small time delay element r(not shown) may be included in this circuit path to provide a more defined pulse at the threshold detector output, which will generate the transition times $t_k$. The integrator constant κ, the threshold δ, the bias b in FIG. 9 are strictly positive real numbers; x(t), t∈R, is a signal of finite energy on R that models the input stimulus to the TEM. Furthermore, x is bounded, |x(t)|≤c<b, and band limited to [–Ω,Ω]. The output of the integrator in a small neighborhood of $t_o+\Delta, t>t_o+\Delta$ is given by:

$$y(t) = y(t_o + \Delta) + \frac{1}{k_{t_0}}\int_{+\Delta}^{t}[x(u)+b]du. \qquad (\text{Eq. 12})$$

The term Δ represents the absolute refractory period of the circuit, which is a small but finite time period between the time the integrator resets and the time the integrator begins its next integration period. The absolute refractory period alters the transfer function of the integrator from h(t)=1 for t≧0 and h(t)=0 for all other t, to h(t)=1 for t≧Δ and h(t)=0 for all other t. Due to the bias signal b, the integrator output y=y(t) is a continuously increasing function. The output of the TEM is a time sequence $(t_k)$, k∈Z.

The output of the TEM of FIG. 9 is a strictly increasing set of trigger times $(t_k)$, k∈Z., that satisfy the recursive equation $$\int_{t_k+\Delta}^{t_{k+1}} x(u)du = -b(t_{K+1} - t_K - \Delta) + \kappa\delta, \qquad (\text{Eq. 13})$$

for all k, k∈Z.

For all input stimuli x=x(t), t∈R, with |x(t)|≤c<b, the distance between consecutive trigger times $t_k$ and $t_{k+1}$ is given by:

$$\frac{\kappa\delta}{b+c} + \Delta \le t_{k+1} - t_k \le \frac{\kappa\delta}{b+c} + \Delta \qquad (\text{Eq. 14})$$

for all k, k∈Z.

The circuit of FIG. 9 can be generalized further by considering the integrator circuit to be a non-ideal integrator. If the capacitor in the integrator circuit is considered leaky, i.e., in parallel with a finite resistance, the leaky integrator resembles a more general low pass filter response. The leaky integrate-and-fire circuit can be defined by the transfer function:

$$h(t)=(1/\kappa)e^{-t} \quad t\geq 0; \quad h(t)=0 \text{ otherwise}.$$

The embodiments described above demonstrate the application of a TEM and TDM to encode and decode signals in a single channel. In many signal processing applications, such as medical engineering applications including hearing aides, MRI and the like, it is often desirable to partition a relevant signal bandwidth into a number (M) of adjacent or overlapping subbands or channels. A multichannel processing approach provides several advantages, including the ability to tailor the response characteristics within the overall system bandwidth and the ability to reduce the clock speed or average spike rate of any associated circuitry in each of the M channels. Multichannel processing has been used previously in connection with traditional filtering and synchronous amplitude sampled systems. It has now been determined that such an approach is also well suited to the use of TEMs and TDMs to encode and decode the signals in each of the in channels. An example of such a system is provided in FIGS. 11 and 12.

FIG. 11 is a block diagram illustrating an encoder system using a multichannel signal processing circuit in accordance with an embodiment of the invention wherein an input signal f(t) is applied to an input 1110 of a filter bank 1105. The filter bank 1110 includes M filter elements 1120, 1130, 1140. The M filter elements in the filter bank 1105 are coupled to a corresponding TEM 1150, 1160, 1170. The TEM's 1150, 1160, 1170 can take on various forms, such as the ASDM (FIG. 1) and integrate and fire neuron circuits (FIG. 9) described above. The circuit of FIG. 11 has now been found to be invertible if the M filter elements of the filter bank 1105 are selected such that, overall, no signal frequency is lost. Thus, it is preferable in the selection of the parameters for the M filters for the center frequency and bandwidth of the M filters to be selected such that overall bandwidth of f(t) is partitioned with the response of the filters 1120, 1130, 1140 being at least adjacent, and more preferably overlapping.

The individual filter elements should be selected to be of a form which is invertible. If the filters are selected such that the overall response of the circuit of FIG. 11 is invertible, the multichannel time decoding subsystem of FIG. 12 can be employed to receive the M channels of time encoded trigger information $(t_k^m, \delta^m(t_k^m))$ k∈Z, and recover the input signal f(t). Since the average spike rate(i.e., the average rate of occurrence of the output pulses $t_k$) of the TEM's is related to the bandwidth of signal being processed, by partitioning the total bandwidth over M channels, the average spike rate of each TEM is reduced accordingly. The spike rate reduction will be approximately determined by the ratio of total bandwidth of the filter bank 1105 to the individual filter bandwidth in each of the M filter elements. Indeed, through the selection of the number of processing channels M, the average spike rate of the trigger output pulses from the TEM's can be made arbitrarily small. While the use of the TEM over traditional sampling techniques already provides substantial benefits, the multichannel processing approach of FIGS. 11 and 12 is particularly advantageous in reducing the average spike rate in a particular system.

Referring to FIG. 11, any number of filter design methodologies can be used to implement the filter bank 1105 and the M filter elements 1135, 1140, 1145, such as a Gabor transform or wavelet transform. Filter design using these well known transforms is well understood to those of ordinary skill in the art and is described in references such as the article "Wavelets and Subband Coding" by Martin Vetterli and Jelena Kovacevic, Prentiss Hall, 1995, which is hereby incorporated by reference. The exemplary embodiment illustrated in FIGS. 11 and 12 demonstrates an implementation based on wavelet transforms, but it will be appreciated that the present invention is not limited to such an embodiment.

FIG. 12 is a block diagram of a circuit for time decoding and recovery of a signal encoded in accordance with the circuit of FIG. 11. The circuit includes M TDMs 1220, 1225, 1230 corresponding to the M channels of filter-TEM channels in FIG. 11. Each TDM 1220, 1225, 1230 receives the time encoded trigger information $(t_k^m, \delta^m(t_k^m))$k∈Z, from the corresponding channel of the encoder circuit at inputs 1205, 1210 and 1215, respectively. The design and operation of a TDM is described above in connection with FIGS. 5 and 6. Each of the M TDMs has an output coupled to a corresponding filter, one of M elements 1235, 1240, 1245. The outputs of the filter elements 1235, 1240, 1245 are then coupled to a corresponding group of M multipliers 1250, 1255, 1260. The output of the multipliers are then coupled to a summing circuit 1270.

The multipliers also receive a scaling factor input $s_m$ to rescale the amplitude of the processed signals. The TDMs 1220, 1225, 1230 receive the sets of trigger times encoded from the output of the corresponding TEMs and recover the respective continuous filtered waveforms ($x^m$(t)) for each of the M channels. After the continuous filtered waveforms for each channel are recovered, the signals $x^m$(t) are passed through corresponding filters and multipliers in each of the M channels in order to recover and scale the signals which are applied to the summing circuit 1270 to combine the signals from the M channels and recover f(t).

In a wavelet transform embodiment the recovery operator can be described using wavelet frames as follows:

The variable f will denote the stimulus and h the mother wavelet. The variable s denotes the dilation factor. Both f and h have finite energy. Three operators are then defined as follows:

Dilation Operator $(D_s h)(u) = |s|^{1/2} h(su)$ (15)

Translation Operator $(\tau_t h)(u) = h(u-t)$ (16)

Involution Operator $\tilde{h}(u) = \overline{h}(-u)$ (17)

where the bar stands for the complex conjugate.

The continuous wavelet transform (CWT) is given by:

$$(W_h f)(t,s) = <f, \tau_t D_s h> \qquad (18)$$
$$= |s|^{1/2} \int_R f(u) \overline{h}(s(u-t)) du$$
$$= |s|^{1/2} \int_R f(u) \tilde{h}(s(t-u)) du$$
$$= (f * D_s \tilde{h})(t).$$

For practical implementations, it is preferable to sample the time-scale plane. A class of sampling sets that facilitates a simple filter bank implementation is given by:

$$\Gamma = \{t, s_m\}_{m=1,2,\ldots,M} \qquad (19)$$

and the analysis filter bank is specified by:

$$(W_h f)(t, s_m) = <f, \tau_t D_{s_m} h> = (f * D_{s_m} \tilde{h})(t) = x^m(t) \qquad (20)$$

The mother wavelet h, the number of filters M, and the scales $\{s_m\}$ determine the frequency ranges over which the analysis filter bank operates.

With "hat" denoting the Fourier transform, it is noted that $$(x^m)^\wedge(\omega) = (\hat{f} \cdot D_{s_m^{-1}} \hat{\tilde{h}})(\omega) \qquad (21)$$

By multiplying both sides with $s_m \cdot D_{s_m^{-1}} \hat{h}$ we obtain:

$$\sum_{m=1}^M s_m \cdot (x^m)^\wedge(\omega)(D_{s_m^{-1}} \hat{h})(\omega) = \sum_{m=1}^M s_m \cdot \left(\hat{f} \cdot D_{s_m^{-1}} \hat{\tilde{h}}\right)(\omega) \qquad (22)$$

$$(D_{s_m^{-1}} \hat{h})(\omega)$$

$$= \hat{f}(\omega) \sum_{m=1}^M s_m \cdot \left| D_{s_m^{-1}} \hat{h}(\omega) \right|^2$$

It is assumed that $$C = \sum_{m=1}^M \left| \hat{h}(s_m^{-1} \omega) \right|^2 > 0. \qquad (23)$$

for all ω∈[−Ω, Ω]. Denoting by the inverse Fourier transform of $C^{-1}(\omega)$, i.e., $c(t) = (C^{-1})(t)$ for all t,t∈ℜ as c(t),t∈ℜ, we have the following:

Proposition. The stimulus f(t) can be perfectly recovered from $(x^m(t))_{t \in \Re}$, m=1, 2, . . . , M and $$f(t) = \left( \sum_{m=1}^M s_m \cdot (x^m * D_{s_m} h) * c \right)(t) \qquad (24)$$

provided that

-continued $$C = \sum_{m=1}^{M} |\hat{h}(s_m^{-1}\omega)|^2 > 0. \qquad (25)$$

for all $\omega \in [-\Omega, \Omega]$.

The present invention provides systems and methods for digitizing an analog signal using time encoding rather than amplitude encoding of the signal. The present methods also provide for recovery of the time encoded signal with an error which is comparable to that of traditional amplitude encoding when the sampling occurs at or above the Nyquist sampling rate. The present methods are particularly well suited for low voltage analog applications where amplitude sampling may be limited by the small voltage increments represented by each bit when high resolution sampling is required with only a limited voltage supply. The ability to accurately encode analog signals using limited supply voltages makes the present circuits and methods well suited to use in nano-scale integration applications. By using a multichannel topology, the advantages of the use of asynchronous time encoding and decoding are enhanced. Significant reductions in the average spike rate of a sampled system are derived by the use of the multichannel approach described herein.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A multichannel TEM encoder circuit comprising:
a filter bank having an input bandwidth and comprising a plurality (M) of filter elements, the M filter elements being selected such that the response of the M filters are at least adjacent and collectively at least fully span the bandwidth of the filter bank;
a plurality (M) of time encoding machines (TEMs), each of the M TEMs being operatively coupled to a corresponding one of the M filter elements;
wherein the TEMs take the form of an integrate and fire neuron circuit, and
wherein the M filter elements are selected to have a center frequency and bandwidth such that at least a portion of the responses overlap.

2. A decoder circuit for decoding a signal encoded by a multichannel TEM encoder comprising:
a bank of M time decoding machines (TDMs), each of the M TDMs having an input for receiving a set of asynchronous trigger values representing at least a portion of a signal to be decoded;
a bank of M filter elements, each of the M filter elements being operatively coupled to a corresponding one of the M TDMs, the bank of M TDMs and M filter elements having an overall response selected to at least substantially invert the encoding process of the multichannel TEM encoder used to encode the signal;

wherein each of the M TDMs further comprise:
a time measurement circuit, the time measurement circuit generating an N-bit quantized representation of the time value of the transitions provided at an input terminal of the time measurement circuit;
a processor coupled to the time measurement circuit and receiving the output of the time measurement circuit at a rate at least equal to the Nyquist rate of a signal to be decoded, the processor being programmed to perform the steps:
generating a set of weighted impulse functions based upon the timing of the zero crossings; and
applying the set of weighted impulse functions to an impulse response filter to recover the input signal.

3. The decoder circuit of claim 2, wherein consecutive zero crossings of the corresponding TEM used to encode the signal define time intervals and wherein the weighted impulse functions have time values that are centered on the time intervals of the TEM output signal.

4. The decoder circuit according to claim 3, wherein the weighted impulse functions have a weighting value determined by the processor by evaluating consecutive zero crossings and at least one property of the TEM.

5. The decoder circuit according to claim 4, wherein the weighted impulse functions have weighting value coefficients $c_k$ determined by the processor which can be expressed in matrix form as a column vector, c:

$$c = (G + \lambda^* I)^+$$

where $\lambda$ is a constant, I is an identity matrix and q is a column vector and $$\int_{t_k}^{t_{k+1}} x(u)du = (-1)^k[-b(t_{k+1} - t_k) + 2\kappa\delta]$$

$$q = \left[\int_{t_k}^{t_{k+1}} x(u)du\right] \text{ and } G = \left[\int_{t_l}^{t_{l+1}} g(u - s_k)du\right] \text{ and where } G^+$$

denotes the pseudo-inverse of matrix G.

6. The decoder circuit according to claim 3, wherein the M TEMs used to encode the signal are each characterized at least in part by the relationship $\delta < (\pi/\Omega)((b-c)/\kappa)$, where $\delta$ represents a hysteresis value of the corresponding TEM, b represents an output voltage of the corresponding TEM, $\kappa$ represents an integration constant of the corresponding TEM, $\Omega$ represents the bandwidth of the input signal for the Mth channel $x^m(t)$ and c represents the maximum amplitude bound of the input signal, and wherein the sequence of transition times generated by the corresponding TEM can be expressed as $$\int_{t_k}^{t_{k+1}} x(u)du = (-1)^k[-b(t_{k+1} - t_k) + 2k\delta].$$

* * * * *

UNITED STATES PATENT AND TRADEMARK OFFICE
CERTIFICATE OF CORRECTION

PATENT NO. : 7,336,210 B2
APPLICATION NO. : 11/285457
DATED : February 26, 2008
INVENTOR(S) : Aurel A. Lazar It is certified that error appears in the above-identified patent and that said Letters Patent is hereby corrected as shown below:

At Col. 1, line 12, please replace "No. 60/473,566. filed" with "No. 60/473,566, filed";

At Col. 6, line 61, please replace "((b–c)/κ,)" with "((b-c)/κ)";

At Col. 8, line 8, please replace "value(the" with "value (the";

At Col. 8, line 46, please replace "$t_K=[t_o$" with ""$t_K=[t_0$";

At Col. 8, line 51, please replace "interval($t_K$" with "interval ($t_K$";

At Col. 8, line 54, please replace "$t_o$" with "$t_0$";

At Col. 10, line 50, please replace "lim$x_l(t)$" with "$lim\ x_l(t)$";

At Col. 11, line 47, please replace "r(not shown)" with "τ (not shown)";

At Col. 12, line 49, please replace "the in channels" with "the *m* channels";

At Col. 13, line 7, please replace "rate(i.e." with "rate (i.e.";

At Col. 14, equation 20, please replace

" $(W_h f)(t, s_m) = <f, \tau_t D_{s_m} h> = (f * D_{s_m} \tilde{h})(t) = x^m(t)$ " with " $(W_k f)(t, s_m) = <f, \tau_t D_{s_m} h> = (f * D_{s_m} \tilde{h})(t) = x^m(t)$ ";

At Col. 14, equation 21, please replace " $(x^m)\hat{}(\omega) = (f \cdot D_{s_m}{-1}\tilde{h})(\omega)$ " with " $(x^m)\hat{}(\omega) = (\hat{f} \cdot D_{s_m^{-1}} \tilde{h})(\omega)$ "; and

UNITED STATES PATENT AND TRADEMARK OFFICE
CERTIFICATE OF CORRECTION

PATENT NO. : 7,336,210 B2
APPLICATION NO. : 11/285457
DATED : February 26, 2008
INVENTOR(S) : Aurel A. Lazar It is certified that error appears in the above-identified patent and that said Letters Patent is hereby corrected as shown below:

At Col. 14, line 60, please replace " $(x^m(t))_{t \in \mathfrak{R}}$ " with " $(x^m(t))_{t \in \mathbb{T}}$ "

Signed and Sealed this

Seventeenth Day of February, 2009

JOHN DOLL
*Acting Director of the United States Patent and Trademark Office*